(12) United States Patent
Rockenberger et al.

(10) Patent No.: US 7,977,240 B1
(45) Date of Patent: Jul. 12, 2011

(54) METAL INKS FOR IMPROVED CONTACT RESISTANCE

(75) Inventors: Joerg Rockenberger, San Jose, CA (US); Yu Chen, Pearland, TX (US); Fabio Zürcher, Brisbane, CA (US); Scott Haubrich, Albuquerque, NM (US)

(73) Assignee: Kovio, Inc., Milpitas, CA (US)

(*) Notice: Subject to any disclaimer, the term of this patent is extended or adjusted under 35 U.S.C. 154(b) by 49 days.

(21) Appl. No.: 12/371,239

(22) Filed: Feb. 13, 2009

Related U.S. Application Data

(60) Provisional application No. 61/028,492, filed on Feb. 13, 2008.

(51) Int. Cl.
*H01L 21/44* (2006.01)
*H01L 21/4763* (2006.01)

(52) U.S. Cl. .. 438/674; 438/622; 438/637; 257/E21.273

(58) Field of Classification Search .................. 438/783, 438/622, 637, 662, 795, 674; 257/E21.174, 257/E21.273, E21.581, E21.159, E21.19, 257/E21.409

See application file for complete search history.

(56) References Cited

U.S. PATENT DOCUMENTS 7,732,349 B2 * 6/2010 Yamamoto .................... 438/783
7,749,299 B2 * 7/2010 Vanheusden et al. ........... 75/362

* cited by examiner

*Primary Examiner* — Walter L Lindsay, Jr.
(74) *Attorney, Agent, or Firm* — The Law Offices of Andrew D. Fortney; Andrew D. Fortney

(57) ABSTRACT

Metal ink compositions, methods of forming such compositions, and methods of forming conductive layers are disclosed. The ink composition includes a bulk metal, a transition metal source, and an organic solvent. The transition metal source may be a transition metal capable of forming a silicide, in an amount providing from 0.01 to 50 at. % of the transition metal relative to the bulk metal. Conductive structures may be made using such ink compositions by forming a silicon-containing layer on a substrate, printing a metal ink composition on the silicon-containing layer, and curing the composition. The metal inks of the present invention have high conductivity and form low resistivity contacts with silicon, and reduce the number of inks and printing steps needed to fabricate integrated circuits.

30 Claims, 2 Drawing Sheets

METAL INKS FOR IMPROVED CONTACT RESISTANCE

RELATED APPLICATIONS

This application claims the benefit of U.S. Provisional Application No. 61/028,492, filed Feb. 13, 2008, which is incorporated by reference herein in its entirety.

FIELD OF THE INVENTION

The present invention generally relates to the field of metal inks and methods of making and using the same. More specifically, embodiments of the present invention pertain to metal ink compositions, methods of making such metal ink compositions, and methods of forming conductive layers using such metal ink compositions.

BACKGROUND

Printing technologies generally provide alternative methods to relatively laborious, wasteful, and expensive lithographic techniques for the fabrication of electronic devices and/or integrated circuits. However, advanced techniques and materials that allow for the fabrication of integrated circuits on a variety of substrates using selective deposition, printing and/or imaging technologies are still desired. In printing processes, materials in the form of liquid inks may be selectively deposited (e.g., printed) using techniques such as inkjet printing, gravure printing, screen printing, etc. Because printed electronics is an emerging technology, a limited number of inks are commercially available, and such inks provide a limited number of materials for fabricating electronic devices. Therefore, there is a continued need to develop new inks that not only can be printed using different techniques, but that also expand the palette of materials for fabricating printed devices and provide a variety of different process integration schemes.

In integrated circuits, the devices (e.g., TFT, capacitors, diodes, etc.) are generally connected to each other with metal lines (i.e., interconnects). Integrated circuits with good performance generally include interconnects with low resistivity, and thus not all metals are suitable for use as interconnects. Typical examples of suitable metals are Al, Cu, Au and Ag. Often, metals used for interconnects in integrated circuits do not form low resistivity contacts with the device electrodes (e.g., gate and source/drain electrodes), which are usually made with n+ and/or p+ doped silicon. Therefore, in order to fabricate integrated circuits with good performance, a contact layer formed between the n+/p+ silicon and the metal lines often provides relatively low resistivity between the devices and the interconnects. Typically, silicides are the preferred contact layers used in microelectronic devices, because they can provide ohmic contacts to heavily doped semiconductors (e.g. n+/p+ silicon and/or germanium).

In a process for making printed electronic devices, it is desirable to minimize the number of inks and the number of printing steps to fabricate printed integrated circuits. Therefore, there is a need to develop a metal ink that has high conductivity and that forms low resistivity contacts with n+/p+ silicon, thus eliminating the need for separate inks for the metal interconnect and for contacts between doped silicon and the metal interconnect.

SUMMARY OF THE INVENTION

Embodiments of the present invention relate to metal ink compositions, methods of forming metal ink compositions, and methods of forming conductive layers, such as metal interconnect layers, from the metal inks. More specifically, embodiments of the present invention pertain to forming conductive layers using a metal ink containing additives for improved contact resistance.

A first aspect of the present invention concerns metal ink compositions for use in printed electronics processes, and methods of making the same. The metal inks of the present invention have high conductivity and form low resistivity contacts with doped (e.g., n+ and/or p+) silicon. Thus, the number of inks and printing steps needed to fabricate printed integrated circuits may be minimized because the need for a separate contact-forming ink or layer can be eliminated. In one general embodiment, the metal ink composition comprises a bulk metal, a transition metal source, and an organic solvent. The transition metal source generally comprises a transition metal capable of forming a silicide, in an amount providing from 0.01 to 50 at. % of the transition metal relative to the bulk metal. The metal ink composition may be made by combining at least one component selected from the group consisting of (i) a bulk metal precursor and (ii) a transition metal source with one or more solvents adapted to facilitate coating and/or printing of the composition, dissolving and/or suspending the component(s) in the solvent(s), and adding any remaining component from the group to the solution.

A second aspect of the present invention concerns a method of forming conductive structures from the metal ink compositions described herein. According to one general embodiment, the method for forming a metal interconnect layer comprises (a) forming a layer comprising silicon and/or germanium on a substrate, (b) depositing (e.g., by printing) a metal ink composition on the silicon-containing layer, and (c) curing the metal composition. In general, metal ink compositions suitable for use with the present method comprise a bulk metal and a silicide-forming transition metal source.

The present invention addresses the need to develop metal inks that have high conductivity and that form low resistivity contacts with doped silicon. In a process for making printed electronic devices, the present ink may reduce or minimize the number of inks and the number of printing steps for fabricating printed integrated circuits and/or structures therein, because the need for separate ink or layer to form contacts to silicon is eliminated. These and other advantages of the present invention will become readily apparent from the detailed description of preferred embodiments below.

DETAILED DESCRIPTION OF THE PREFERRED EMBODIMENTS

Figure 1:
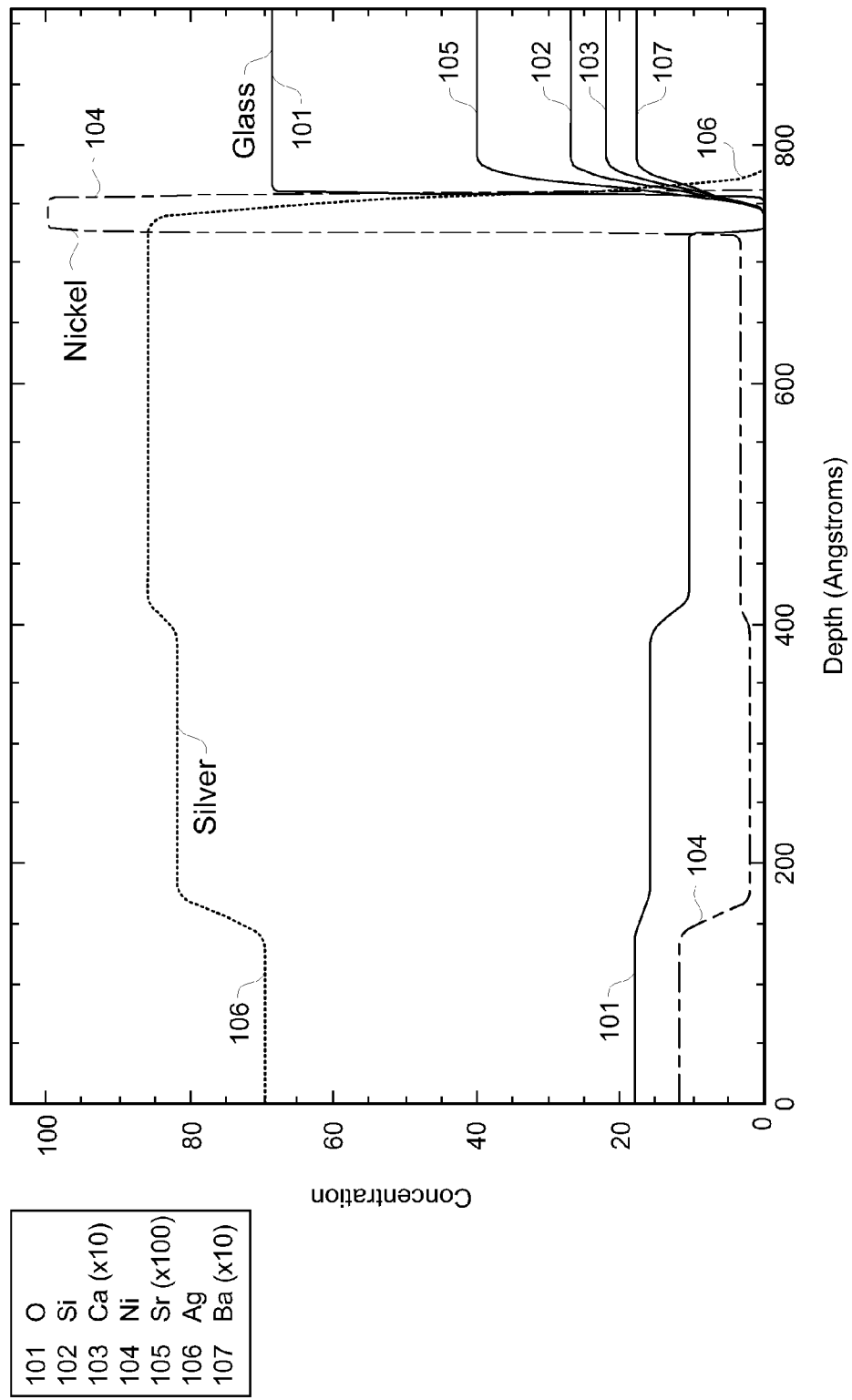
FIG. 1 is a graph showing the concentration of each element in a metal film made according to an embodiment of the present invention, as a function of the depth into the film.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. In addition, it should be understood that the possible permutations and combinations described herein are not meant to limit the invention. Specifically, variations that are not inconsistent may be mixed and matched as desired.

For the sake of convenience and simplicity, the terms "coupled to," "connected to," and "in communication with" mean direct or indirect coupling, connection or communication, unless the context clearly indicates otherwise. These terms are generally used interchangeably herein, but are generally given their art-recognized meanings. Furthermore, the terms "shape," "feature," "line," and "pattern" and use of one such term will generally include the other terms, and may be used interchangeably, although the meaning of the term should be taken from the context in which it is used. Also, for convenience and simplicity, the terms "part," "portion," and "region" may be used interchangeably, but these terms are also generally given their art-recognized meanings. The term "(semi)conductor," "(semi)conductive," "(semi)conducting" and grammatical equivalents thereof refer to materials, precursors, layers, features or other species or structures that are conductive and/or semiconductive. The terms "(poly)silane," "(poly)germane," and "(poly)silagermane" refer to compounds or mixtures of compounds that consist essentially of (1) silicon and/or germanium and (2) hydrogen, and that predominantly contain species having at least 15 silicon and/or germanium atoms. Such species (i.e., silane and/or polysilane) may contain one or more cyclic rings and an amount or atomic percentage of halogen atoms (such as Cl) that does not have a significant adverse effect on the properties of a given composition for a particular application.

In the present application, the term "deposit" (and grammatical variations thereof) is intended to encompass all forms of deposition, including blanket deposition (e.g., CVD and PVD), coating, and printing. In various embodiments, coating may comprise spin-coating, spray-coating, slit coating, extrusion coating, meniscus coating, and/or pen-coating the metal formulation onto the substrate. In other embodiments, printing may comprise inkjetting, gravure printing, offset printing, flexographic printing, screen printing, microspotting and/or pen-coating the metal formulation onto the substrate. In general, coating refers to a process where the ink or other material is deposited on substantially the entire substrate, whereas printing generally refers to a process where the ink or other material is deposited in a predetermined pattern in certain areas of the substrate. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. In addition, the term "doped" refers to a material that is doped with a substantially controllable dose of any dopant (e.g., lightly doped, heavily doped, or doped at any doping level in between).

The invention, in its various aspects, will be explained in greater detail below with regard to exemplary embodiments.

Exemplary Ink Compositions

According to embodiments of the present invention, an ink composition generally comprises a bulk metal, a transition metal source comprising a transition metal capable of forming a silicide (i.e., "silicide-forming transition metal") in an amount providing from 0.01 to 50 at. % of the transition metal relative to the bulk metal, and an organic solvent. In general, the transition metal in the ink composition advantageously reduces the contact resistance between the subsequently formed metal film and a device electrode (e.g., a gate, source or drain of a thin film transistor). The ink composition(s) of the present invention may thus be suitable for use with device electrodes comprising a gate electrode, a source electrode, or a drain electrode of a thin film transistor (TFT). Alternatively, the device may comprise a capacitor, a diode, a sensor, or a photovoltaic cell. The electrodes may comprise n+ silicon, p+ silicon, n+ germanium, p+ germanium, and/or any other similar materials that can be used to form a device electrode.

In exemplary embodiments, the transition metal and the bulk metal comprise different metals. For example, in one preferred embodiment, the bulk metal comprises copper, and the silicide-forming transition metal may comprise cobalt. In another example, the bulk metal comprises silver, and the silicide-forming transition metal comprises tantalum. In still another example, the bulk metal comprises silver, and the silicide-forming transition metal comprises tungsten. In further preferred embodiments, the bulk metal may comprise silver, and the silicide-forming transition metal may comprise cobalt and/or nickel. In other embodiments, the bulk metal may comprise gold, and the silicide-forming transition metal comprises molybdenum and/or tungsten. However, the present invention is not limited to the examples provided herein. The various metals used for the bulk metal and the silicide-forming transition metal may be mixed and matched in the ink formulation as desired to the extent that the different metals are not incompatible.

In exemplary embodiments, the bulk metal may comprise Ag, Pd, Rh, Cu, Pt, Ni, Fe, Ru, Os, Mn, Cr, Mo, Au, W, Co, Ir, Zn, Cd, Al, Ta, or an alloy or combination thereof. Preferably, the bulk metal comprises Cu, Ag, or Au. In general, the ink composition comprises about 1 to 80% by weight of the bulk metal (or any range of values therein). For example, the composition may contain the bulk metal in an amount of from about 5 to 20% by weight, 10 to 30% by weight, etc., of the ink composition.

In general, the ink composition may comprise about 0.001% to about 15% (e.g., from about 0.1% to about 5%, or any other range of values therein) by weight of the transition metal source. In some embodiments, the transition metal source is present in the ink in an amount providing no more than about 20 at. % of transition metal atoms relative to atoms of the bulk metal. For example, the transition metal source may be present in an amount providing about 0.1% to about 5 at. % (or any other range of values up to about 20 at. %) of transition metal atoms relative to the bulk metal.

Furthermore, the transition metal source and the bulk metal may each independently comprise an organometallic compound, a complex, a salt, and/or nanoparticles (e.g., nanocrystals) of the bulk metal and/or transition metal. For example, in one exemplary embodiment, the bulk metal comprises nanoparticles and/or nanocrystals of the bulk metal, and the transition metal comprises an organometallic compound, a complex, or a salt of the transition metal. However, the formulation is not limited to such. In other embodiments, a single ink formulation may comprise a plurality of bulk metal precursors and/or a plurality of transition metal precursors as described herein.

To further illustrate, in some exemplary embodiments, the bulk metal may comprise a metal suitable for use in a metal interconnect layer (e.g., a metal with high conductivity). In some variations, the ink composition may include a bulk metal precursor that may comprise an organometallic compound of the bulk metal, a complex of the bulk metal, a salt of the bulk metal, and/or metal particles (e.g., metal flakes). However, in other implementations, the bulk metal comprises nanoparticles of the bulk metal. For example, the bulk metal may consist essentially of Ag nanoparticles.

Similarly, the transition metal source may comprise an organometallic compound, complex, salt, and/or nanoparticles of one or more silicide-forming transition metals. In some variations, the silicide-forming transition metal may be selected from the group consisting of Ti, Ta, W, Mo, Co, Pt, Cr, Pd, and Ni. In exemplary embodiments, the silicide-forming transition metal is selected from the group consisting of Ta, W, Mo, Co, and Ni. In one preferred embodiment, the silicide-forming transition metal consists essentially of Ni.

In general, organometallic compounds suitable for use in the present ink composition include one or more metal atoms and one or more organic ligands bound thereto (e.g., a ligand comprising a chain or backbone consisting essentially of carbon atoms, bound to the metal by one or more σ- and/or π-bonds). The organic ligand may further contain one or more heteroatoms (e.g., O, N, P, S, etc.), which may be bound to the metal and/or which may have one or more organic substituents (e.g., alkyl, alkenyl, alkynyl, aryl, substituted aryl, aralkyl, etc.) bound thereto. Suitable organic ligands may include carboxylates (e.g., $C_1$-$C_{18}$ carboxylates such as formate and acetate); alkoxides and/or thiolates (e.g., $C_1$-$C_{18}$ alkoxides and/or $C_1$-$C_{18}$ thiolates); $C_5$-$C_{12}$ diketonates; amines of the formula $NR_3$ (where each R may be independently H, alkyl [e.g., $C_1$-$C_{18}$ alkyl], aryl [e.g., $C_6$-$C_{12}$ aryl], etc., but where no more than two R groups can be H); alkenes (e.g., $C_2$-$C_6$ alkenes such as ethene [$C_2H_4$], allyl [$C_3H_5$], substituted allyl, propene [$C_3H_6$], 1- or 2-butene [$C_4H_8$], etc.); polyenes (e.g., $C_4$-$C_{10}$ dienes such as butadiene [$C_4H_6$], hexadiene [$C_6H_{10}$], etc., and cyclic polyenes such as cyclooctadiene [COD], cyclooctatetraene [COT], cyclopentadiene [Cp], permethylcyclopentadiene [Cp*], etc.); arenes (e.g., $C_6$-$C_{12}$ arenes such as benzene [$C_6H_6$], toluene, xylene, mesitylene, naphthalene and anthracene); and phosphines of the formula $PR_3$ (where R is as defined above). The organometallic compounds may contain one or more additional organic and/or inorganic ligands, where the inorganic ligands are as discussed below.

In general, complexes suitable for use in the present ink composition include one or more metal atoms and one or more inorganic ligands bound thereto (e.g., a ligand that does not contain an organic group that could result in carbon incorporation into the metal film formed therefrom). Such ligands may also be bound to the metal by one or more σ- and/or π-bonds. Metal salts (i.e., transition metal or bulk metal salts) suitable for use in the present invention generally include a metal and one or more counter ions bound to the metal by bonds having a predominantly ionic character. Such metal salts may further include one or more inorganic ligands or solvent ligands (as described herein).

In general, the ligand may comprise any ligand(s) that can bind to the transition metal, and in some variations, more than one type of ligand may be present. However, in certain embodiments, the ligand(s) may be selected such that they form substantially only gaseous or volatile byproducts upon decomposition, reduction, and/or sintering of the corresponding metal salt(s) and/or metal complex(es) to an elemental metal or alloy. Thus, in some embodiments, the metal salt(s) and/or complex(es) may have the formula $MX_n$ or $M(L)_pX_n$, where X is a halide, pseudohalide, nitrate, sulfate, formate, cyanate, isocyanate, cyanide and/or isocyanide; n is generally 2-6, and may be equal to the formal charge of M plus any associated cations that are present, divided by the formal charge of X; L may comprise an inorganic ligand selected from the group consisting of $NH_3$, $PX'_3$ (where X' is a halide), $NR'_3$ or $PR'_3$ (where each R' may be independently H, $A_xH_{2x+1}$ [e.g., $Ge_xH_{2x+1}$, $Si_xH_{2x+1}$], cyclo-$A_mH_{2m-1}$, or two R' groups together form a -$A_kH_{2k}$— group, where each A is independently Si or Ge, x is an integer of from 1 to 4, m is an integer of from 3 to 12 [preferably 4 to 8], and k is an integer of from 3 to 7), CO, $H_2S$, and volatile, carbon-free O- and/or N-containing species (such as NO, $N_2$, $NH_2OH$ and/or $H_2O$); and p is an integer equal to the number of coordination sites on M, minus the number of coordination sites occupied by $X_n$. Ligands comprising Si and/or Ge atoms may be preferred for transition metal precursors, because ligands containing Si and/or Ge may favor the formation of a silicide. Exemplary gaseous/volatile ligands and metal salt(s) and/or metal complex(es) suitable for use in the present invention are described in co-pending U.S. patent application Ser. No. 12/131,002, filed on May 30, 2008, the relevant portions of which are incorporated herein by reference.

Suitable metal nanoparticles and/or nanocrystals (hereinafter, "metal nanoparticles") may comprise titanium, copper, silver, chromium, molybdenum, tungsten, cobalt, nickel, gold, palladium, platinum, zinc, iron, etc., or alloys or combinations thereof, preferably copper, silver or gold as bulk metal precursors and cobalt and nickel as transition metal precursors. In exemplary embodiments, the metal nanoparticles consist essentially of a single (elemental) metal. Nanoparticle-containing inks may be preferred because such inks have relatively high mass loading (e.g., in solution or in a relatively uniform, stable suspension), relatively high solubility, relatively small particle size, relatively low sintering temperatures, and relatively high purity.

Where the bulk metal and/or the transition metal source comprise nanoparticles, the nanoparticles may be passivated (e.g., with passivation groups and/or a surfactant). The passivation groups may comprise one or more of the following: (i) an alcohol and/or alcoholate; (ii) a thiol and/or thiolate; (iii) hydrogen and/or a halogen, such as F, Cl, Br, and/or I; (iv) a disulfide; (v) a carboxylate and/or carboxylic acid; (vi) an amine; and/or (vii) a phosphine. The alcohol and/or alcoholate may comprise a $C_4$-$C_{20}$, branched or unbranched, saturated or unsaturated aliphatic alcohol or salt thereof (such as butanol, hexanol, octanol, decanol, dodecanol, tetradecanol, hexadecanol, 2-butenol, 3-butenol, 2-hexenol, 4-hexenol, 5-hexenol, 2-octenol, 6-octenol, 7-octenol, 2-decenol, 9-decenol, 10-decenol, 2-dodecenol, 11-dodecenol, 2-tetradecenol, 13-tetradecenol, 2-hexadecenol, 15-hexadecenol, oleyl alcohol, linoleyl alcohol, linolenyl alcohol, elaidyl alcohol, behenyl alcohol, eleostearyl alcohol and/or arachidonyl alcohol); or a $C_7$-$C_{17}$, branched or unbranched, substituted or unsubstituted aralkanol or salt thereof (such as benzyl alcohol, or a salt thereof). Polyols, such as long-chain alkanediols (e.g., 1,7-octanediol, 1,12-dodecanediol), in an amount of, e.g., 1-10 mol % may cross-link two or more metal nanoparticles. The thiol and/or thiolate may comprise the sulfur-based analogs of the alcohols and/or alcoholates described herein. Unsaturated alcohols and/or thiols, particularly long-chain (e.g., $C_8$-$C_{20}$) unsaturated alcohols and/or thiols, may provide a mechanism or means by which passivated nanoparticles can be crosslinked with ultraviolet radiation. When such nanoparticles are selectively irradiated with an appropriate wavelength of UV light (e.g., through a mask), portions of the nanoparticle-containing composition may be crosslinked, while non-irradiated portions are not. These non-irradiated portions may then be removed with an appropriate solvent to leave a patterned composition on the substrate (see, e.g., co-pending U.S. patent application Ser. No. 10/616,147, filed on Jul. 8, 2003, the relevant portions of which are incorporated herein by reference).

The surfactant may comprise an amine, an amine oxide, a quaternary ammonium salt, a betaine, a sulfobetaine, an ether, a polyglycol, a polyether, a polymer, an organic ester, a phosphine, a phosphate, a sulfonic acid, a sulfonate, a sulfate, a ketone, and/or a silicone. In various implementations comprising a surfactant, suitable surfactants may include a tri-$C_1$-$C_{20}$ alkyl-substituted amine, a tri-$C_1$-$C_{20}$ alkyl-substituted amine oxide, a tetra-$C_1$-$C_{20}$ alkyl-substituted quaternary ammonium salt, a conventional betaine, a conventional sulfobetaine, a polyglycol of the formula H—(—OCH$_2$CH$_2$—)$_a$—OH (where $2 \leq a \leq 4$), a polyether of the formula $R^3$—(—OCH$_2$CH$_2$—)$_a$—OR$^4$ (where $R^3$ and $R^4$ are independently a $C_1$-$C_4$ alkyl group), a $C_4$-$C_{20}$ branched or unbranched, saturated or unsaturated aliphatic carboxylic acid ester of a $C_1$-$C_4$ alcohol or of the alcohols described in the above paragraph, a $C_4$-$C_{20}$ aliphatic carboxylic acid thioester of a $C_1$-$C_4$ thiol or of the thiols described above, a tri-$C_1$-$C_{20}$ alkyl- or triaryl-substituted phosphine (such as trimethyl phosphine, triethyl phosphine, or triphenyl phosphine), a tri-$C_1$-$C_{20}$ alkyl- or triaryl-substituted phosphate, a di-$C_1$-$C_{20}$ alkyl- or diaryl-substituted phosphate salt, an aryl or $C_4$-$C_{20}$ branched or unbranched, saturated or unsaturated aliphatic sulfonic acid, an aryl or $C_4$-$C_{20}$ branched or unbranched, saturated or unsaturated aliphatic sulfonate, a ketone of the formula $R^5$(C=O)$R^6$ (where $R^5$ and $R^6$ are independently a $C_6$-$C_{10}$ aryl group), and/or a conventional silicone. Surfactants are a preferred additive when hydrogen- and/or halogen-passivated nanoparticles are used, as they may facilitate or enable dispersion of such nanoparticles into aprotic and/or relatively nonpolar solvents.

In some embodiments, the nanoparticles, preferably the cores of the nanocrystals, have an average diameter of less than 100 nm (e.g., less than 10 nm, less than 5 nm, etc.). Embodiments that comprise larger nanoparticles (e.g., nanoparticles having an average diameter of from 10 to 100 nm), may be advantageous because an ink formulation containing such nanoparticles may further include a reduced amount of surfactant. In addition, a sintered nanoparticle thin film formed from nanoparticles of varying sizes may exhibit improved packing. In the alternative, the nanoparticle and/or nanocrystals may have a size distribution range such that at least 90% (e.g., at least 95%, at least 98%, etc.) of the nanoparticles have a diameter of from 0.1 nm to 100 nm (e.g., from 0.2 nm to 40 nm, 0.5 nm to 10 nm, or any other range of values therein).

The organic solvent in the ink composition may be selected from the group consisting of saturated hydrocarbons, unsaturated hydrocarbons, aromatic hydrocarbons, halogenated hydrocarbons, ethers, polyethers, esters, amines, amides, alcohols (e.g., $C_1$-$C_{10}$ alcohol, $C_1$-$C_8$ mono- or diol, a $C_1$-$C_4$ alkoxy-substituted $C_1$-$C_6$ alkanol, a $C_1$-$C_6$ alcohol substituted with a $C_3$-$C_5$ heterocyclic group, a $C_1$-$C_4$ alkoxy-substituted $C_1$-$C_6$ alkanol, a $C_1$-$C_6$ alcohol substituted with a $C_3$-$C_5$ heterocyclic group, etc.), glycols, thiols, lactones, phosphates, nitriles, silicones, sulfoxides, fatty acids, ketones, terpenes, terpineols and/or combinations thereof. In other embodiments, the organic solvent may comprise mineral spirits, toluene, benzene, xylene, mesitylene, tert-butyl-toluene, pyridine, cyclohexylbenzene, cyclohexane, cyclooctane, cyclodecane, tetralin, cis-decalin, trans-decalin, 3-octanol, 2-ethylhexanol, alpha-terpineol, dyhydroterpineol, cyclohexanone, ethyl lactate, cyclomethicones, propylene glycol monoethyl ether, diglyme, and/or combinations thereof. In the alternative, the solvent may comprise a polar aprotic organic solvent, such as a $C_1$-$C_6$ alkyl ester of a $C_1$-$C_4$ alkanoic acid, a cyclic ether or polyether, or dimethyl formamide (or other solvent described herein).

The organic solvent may be present in varying amounts. For example, the organic solvent may be present in an amount from 5 to 99 wt. % or any range of values therein. In an exemplary embodiment, the organic solvent mixture is formulated to provide a predetermined formulation viscosity, surface tension, and evaporation rate that are appropriate to facilitate coating and/or printing (especially printing) of the formulation. For example, the organic solvent may be added in a volume (or volume ratio) sufficient to provide a viscosity of about 2 to 15 cP (e.g., 2 to 10 cP or any other range of values therein) and/or a surface tension of at least 20 dynes/cm (e.g., at least 25 dynes/cm, from 25 dynes/cm to about 100 dynes/cm, or any other value[s] in the range). In other examples, the organic solvent may be added in a volume or volume ratio sufficient to formulate a paste suitable for screen printing (e.g., a paste having a viscosity greater than or about 10,000 cP) or to formulate an ink suitable for gravure printing (e.g., an ink having a viscosity up to 200 cP).

In some alternative implementations, the ink formulation(s) of the present invention may further comprise a crystallization promoter. For example, the crystallization promoter may comprise Ni, Au, Al, Fe, or combinations thereof. In some embodiments, the crystallization promoter may comprise metal nanoparticles (e.g., Ni, Au, Al, Fe, or a combination thereof). In other implementations, the crystallization promoter may comprise an organometallic crystallization promoting compound (e.g., containing Ni, Au, Al, Fe, or a combination thereof). In embodiments comprising Ni, Au, Al, or Fe as transition metal source, an additional amount of Ni, Au, Al, or Fe may be used as the crystallization promoter. In the alternative, where Ni, Au, Al, or Fe are used as the bulk metal or transition metal source, a different crystallization promoter metal may be selected as the crystallization promoter. For example, if the formulation comprises Ni as the transition metal, then Au, Al, or Fe may be used as the crystallization promoter, or alternatively, an additional amount of Ni effective for both silicide formation and crystallization promotion may be used instead. Crystallization promoters used in ink formulations are believed to help crystallize amorphous silicon and form a device layer (e.g., a polycrystalline semiconductor layer) during a curing and/or annealing process (see, e.g., U.S. Pat. Nos. 7,259,100, 7,259,101, and 7,078,276).

To illustrate, a bulk nanoparticle source, such as Ag nanoparticles, and a crystallization promoter (e.g., an amount of an organometallic compound and/or metal nanoparticles of Ni, Au, Al and Fe) are dispersed or dissolved in a suitable solvent medium as described herein. The ink formulation containing the crystallization promoter may then be deposited onto an amorphous semiconductor layer and cured. During the curing process, the transition metal in the nanoparticle ink segregates to the interface on the silicon layer and the surface of the printed interconnect metal layer. The added transition metal can induce crystallization in the underlying amorphous semiconductor (e.g., silicon) layer, thereby converting it to a polycrystalline semiconductor layer.

Exemplary Methods of Making an Ink Formulation

Another aspect of the present invention concerns method of making ink formulations. In general, an exemplary ink formulation may be made by combining at least one component selected from the group consisting of (i) a bulk metal or bulk metal precursor (e.g., Ag, Pd, Rh, Cu, Pt, Ni, Fe, Ru, Os, Mn, Cr, Mo, Au, W, Co, Ir, Zn, Cd, Al, Ta, or a combination thereof) and (ii) a transition metal source (e.g., Ti, Ta, W, Mo, Co, Pt, Cr, Pd, and Ni, or a combination thereof) with one or more solvents (e.g., organic solvents) adapted to facilitate coating/printing of the composition, and dissolving or suspending the component(s) in the solvent(s). Any remaining components (e.g., the transition metal source or the bulk metal) may then be added to the solution. The solvent and the metal components may be mixed sufficiently to dissolve or suspend the components in the ink formulation for a sufficient length of time to print or otherwise deposit the ink formulation. In preferred embodiments, the transition metal is a silicide-forming transition metal and the bulk metal comprises a metal suitable for use as an interconnect in electronic devices as described herein with regard to exemplary ink compositions.

In some embodiments, the method may further comprise adding one or more conventional additives, such as a surface tension reducing agent, a surfactant, a binding agent, a thickening agent, a photosensitizer, etc., to the formulation. Preferably, however, the formulation is free from components that may introduce impurity atoms or other species that may adversely affect the electrical properties of a thin film formed from the composition (e.g., carbon, nitrogen, alkali metals, etc.). When they are present, typical amounts of the additives in the composition are from 0.01 wt. % to 10 wt. % (e.g., in trace amounts, or from 0.1 wt. % to 5 wt. %) of the composition. However, such additives are not necessary. In fact, it may be advantageous to exclude the additives from the ink, particularly where such additional components include sufficiently high molar proportions of elements such as carbon, oxygen, sulfur, nitrogen, or halogens to adversely affect electrical properties of the resulting thin film.

The components of the ink formulation may be combined in any order. The components may be mixed by mechanical stirring, magnetic stirring, shaking or other form of physical agitation, blending, etc. In some embodiments, the ink may be mixed or formulated under an inert atmosphere (e.g., Ar or $N_2$, preferably Ar) to avoid unacceptably high oxygen content in the formed films and/or oxidation of some of the ink components.

Exemplary Methods of Forming a Metal Interconnect Layer

In general, a metal interconnect layer may be formed by depositing (e.g., by printing) a metal ink composition (e.g., comprising a bulk metal and a silicide-forming transition metal source) on a silicon- and/or germanium-containing layer, and then curing the metal composition. Thus, structures/features in electronic devices can be made by depositing a layer comprising silicon on a substrate, then forming a metal interconnect and a transition metal silicide contact in the same deposition, patterning and annealing sequence, in accordance with the present invention.

The silicon- and/or germanium-containing layer may be formed on any suitable substrate. The substrate generally comprises a mechanical support structure, which may be electrically inert or active, and which may include one or more predetermined physical, electrical and/or optical properties. Suitable electrically inert or inactive substrates may comprise a glass or other ceramic plate, disc, sheet or slip (e.g., comprising display-type glass, quartz, etc.), a dielectric and/or a plastic sheet or disc, etc. Alternatively, suitable electrically conductive substrates may comprise a semiconductor wafer or disc (e.g., a silicon wafer), a metal disc, sheet or foil (e.g., metal film, metal sheet, and/or metal foil), etc. Any of the above-mentioned substrates may further include one or more buffer, passivation and/or insulating layers (such as a polyimide or other polymer, silicon oxide and/or aluminum oxide, etc.) thereon.

In embodiments comprising a metal substrate, the metal substrate may comprise aluminum, titanium, copper, silver, chromium, molybdenum, tungsten, nickel, gold, palladium, platinum, zinc, iron, steel (e.g., stainless steel) or any alloy thereof. Suitable substrates are described in detail in co-pending U.S. patent application Ser. No. 11/888,949, filed Aug. 3, 2007, the relevant portions of which are incorporated herein by reference.

The substrate may also include any number of previously fabricated device layers thereon and/or therein, such as conductive layers, dielectric layers, semiconducting layers, or combinations thereof. In exemplary embodiments, an exposed silicon-containing layer (e.g., one or more device electrodes, etc.) and/or a dielectric layer (e.g., a substrate passivation and/or interlayer dielectric, etc.) are formed on the substrate. The exposed layer comprising silicon may be deposited and patterned by any method known in the art. For example, the silicon layer may be deposited onto a dielectric surface of the substrate by conventional blanket deposition (e.g., by chemical vapor deposition [CVD], low pressure CVD, sputtering, electroplating, spin coating, extrusion coating, spray coating, etc.) and patterned by photolithography and etching, etc. Alternatively, the silicon layer may be substantially simultaneously deposited and patterned by printing.

In one embodiment, the silicon- and/or germanium-containing layer is a semiconductor layer, formed from a silicon- and/or germanium-containing semiconductor ink or a silicon/germanium precursor ink. The semiconductor or silicon precursor ink may comprise one or more precursor compounds (e.g., a [doped] silicon-containing compound such as a [poly]silane or a [poly]silagermane, which may further include a [poly]germane and/or a dopant source) and a solvent in which the compounds are soluble or suspendable (e.g., a $C_6$-$C_{20}$ branched or unbranched alkane that may be substituted with one or more halogens, a $C_6$-$C_{20}$ branched or unbranched alkene, a $C_2$-$C_6$ branched or unbranched alkene substituted with one or more halogens, a $C_5$-$C_{20}$ cycloalkane such as cyclohexane, cyclooctane or decalin, a $C_6$-$C_{10}$ aromatic solvent such as toluene, xylene, or tetralin, a di-$C_1$-$C_{10}$ alkyl ether having a total of at least 4 carbon atoms such as diethyl ether or methyl t-butyl ether, and/or a $C_4$-$C_{10}$ cyclic alkyl ether such as tetrahydrofuran or dioxane, etc.). Alternatively or additionally, the semiconductor or silicon precursor ink may comprise nanoparticles of one or more semiconductor elements such as Si, Ge or SiGe, etc. The semiconductor ink formulation may also comprise a surface tension reducing agent, a surfactant, a binder and/or a thickening agent. However, such additives or agents may be omitted. Various exemplary semiconductor ink formulations suitable for use in the present method, and methods for making such ink formulations are described in co-pending U.S. patent application Ser. Nos. 10/616,147, 10/789,317, 11/452,108, 11/888,949, 11/888,942 and 12/131,002, filed on Jul. 8, 2003, Feb. 27, 2004, Jun. 12, 2006, Aug. 3, 2007, Aug. 3, 2007, and May 30, 2008, respectively, the relevant portions of which are incorporated herein by reference.

In addition, the silicon precursor ink may be lightly or heavily doped. In preferred embodiments, the silicon- and/or germanium-containing layer is highly doped. In the case of silicon or silicon-germanium, the dopant may be selected from the group consisting of boron, phosphorous and arsenic, typically in a conventional concentration (e.g., light or heavy, and/or from $10^{13}$ to $10^{15}$, $10^{15}$ to $10^{17}$, $10^{16}$ to $10^{18}$, $10^{17}$ to $10^{19}$, $10^{19}$ to $10^{21}$ atoms/cm$^3$ or any range of values therein). Methods for printing or otherwise forming doped semiconductor thin films from such liquid-phase doped (silicon) precursor inks are disclosed in U.S. Pat. No. 7,314,513 and co-pending U.S. patent application Ser. No. 10/616,147, filed on Jul. 8, 2003, the relevant portions of each of which are incorporated herein by reference.

In preferred embodiments, the layer containing silicon and/or germanium is formed on the substrate by printing techniques such as inkjet printing, gravure printing, In general, the layer containing silicon has a thickness of from 50 to 200 nm. However, the thickness is not limited as such, and may have any other thickness as desired. The thickness of the printed silicon layer may be controlled. For example, if a thicker silicon and/or germanium layer is desired, the number of drops, the drop volume, or the ink volume can be increased. A thicker layer may also be achieved by decreasing the pitch between drops.

In some variations, the layer containing silicon may be formed on a dielectric layer on the substrate. In such embodiments, the dielectric layer may comprise any suitable electrically insulating dielectric material. For example, the dielectric material may comprise oxide and/or nitride ceramics or glasses (e.g., silicon dioxide, silicon nitride, silicon oxynitride, aluminum oxide, tantalum oxide, zirconium oxide, etc.), polymers such as polysiloxanes, parylene, polyethylene, polypropylene, undoped polyimides, polycarbonates, polyamides, polyethers, copolymers thereof, fluorinated derivatives thereof, etc. In some embodiments, the dielectric layer may be an inorganic insulator. For example, the dielectric may comprise a metal oxide and/or nitride of the formula $M_xO_yN_z$, wherein M is silicon or a metal selected from the group consisting of aluminum, titanium, zirconium, tantalum, hafnium, vanadium, chromium, molybdenum, tungsten, rhodium, rhenium, iron, ruthenium, copper, zinc, indium, tin, lanthanide metals, actinide metals, and mixtures thereof. In embodiments comprising a conductive substrate, the dielectric may comprise a corresponding oxide of the metal used in the conductive substrate.

The dielectric layer may be formed by any suitable method known in the art. In embodiments having a conductive substrate, the dielectric layer may be formed by oxidizing and/or nitriding the conductive substrate (or a liquid oxide/nitride precursor formed or deposited thereon), generally in an oxidizing and/or nitriding atmosphere. For example, the dielectric can be formed by anodic oxidation (see, e.g., U.S. Pat. Nos. 7,152,804 and 7,286,053), oxidizing a liquid silane printed onto a metal substrate (e.g., stainless steel, aluminum foil, etc.), or by coating the substrate with another material (e.g., silicon, aluminum, chromium, hafnium, etc.) that can be oxidized or nitrided to form a dielectric. In the alternative, the dielectric may be formed by depositing (e.g., by printing or chemical bath deposition processes) a dielectric precursor material (e.g., a SiO$_2$ precursor such as a tetraalkoxysilane, a cyclic siloxane such as c-([SiH$_2$]O)$_5$, or a silicon halide such as SiCl$_4$ or H$_2$SiF$_6$) and subsequently converting the precursor to a dielectric film (e.g., by drying, curing, and/or annealing). In other embodiments, the dielectric layer may be formed by blanket deposition or coating (e.g., spray coating, dip coating, blade coating, meniscus coating, slit coating, extrusion coating, pen-coating, microspotting, spin-coating, etc.) or a vacuum deposition method such as CVD, PECVD, LPCVD, sputter deposition, etc. In such embodiments, areas of the substrate may be subsequently patterned and/or exposed as desired by etching techniques known in the art.

Alternatively, the dielectric layer may be formed by printing techniques known in the art (e.g., inkjet printing, gravure printing, screen printing, offset printing, flexography, syringe dispensing, microspotting, stenciling, stamping, pump dispensing, laser forward transfer, local laser CVD and/or pen-coating, etc.). In some embodiments, the dielectric layer may be selectively printed such that areas of the substrate (e.g., conductive substrate) are exposed. In the alternative, the dielectric layer may be printed to cover the entire substrate, and then etched using subsequently formed structures as a mask. Various compositions and methods for printing dielectrics, and methods of forming dielectric films therefrom are described in co-pending U.S. patent application Ser. Nos. 11/452,108, 11/818,078, 11/888,942, 11/888,949, and 11/842,884, filed on Jun. 12, 2006, Jun. 12, 2007, Aug. 3, 2007, Aug. 3, 2007, and Aug. 21, 2007 respectively, the relevant portions of which are incorporated herein by reference.

In embodiments relating to a TFT, a gate may be formed on the silicon-containing layer prior to printing the metal composition. In such embodiments, the gate may comprise a gate dielectric layer on the silicon-containing layer, and a gate electrode on the gate dielectric layer. In addition, source and drain regions may be formed in or on the silicon-containing layer in the regions adjacent to the gate.

In some embodiments relating to a diode (e.g., a Schottky diode, Zener diode, photodiode, etc.), first and second electrodes may be formed to different doped or undoped silicon-containing layers in the diode. The doped silicon-containing layers can be formed by doping the surface of the silicon-containing (e.g., semiconductor) layer, or alternatively, by depositing a doped semiconductor (e.g., silicon) layer on the substrate or differently-doped silicon layer. Thereafter, the present ink formulation can be printed onto one or more layers of the diode and cured/annealed as described herein to simultaneously form a transition metal silicide contact and a bulk metal interconnect as described herein. In these embodiments, a first electrode may be formed to the doped silicon layer(s) in the diode by forming a silicide contact on the doped semiconductor layer from the silicide-forming metal ink composition, and a second electrode may be formed from a silicide Schottky (or other) contact to a relatively low-concentration or low-dose doped silicon layer. However, the method is not limited as such, and it is not necessary to form a silicide contact when forming a diode. On the contrary, in some embodiments, a metal-semiconductor contact (without intervening silicide) can be used to form a Schottky or other contact to doped silicon (e.g., from a metal interconnect). For example, in the case of aluminum, a metal-semiconductor contact may form an ohmic contact to doped silicon. Exemplary diodes and methods of forming such diodes from silicide-forming metal inks are described in detail in co-pending U.S. patent application Ser. Nos. 12/175,450 and 12/243,880, respectively filed Jul. 17, 2008 and Oct. 1, 2008, the relevant portions of which are incorporated herein by reference.

Similarly, in embodiments relating to a capacitor (e.g., a MOS capacitor), a lower electrode may be formed to a doped silicon- or silicon/germanium-containing (semiconductor) layer, before or after forming a capacitor dielectric layer (e.g., an oxide layer, such as SiO$_2$, Al$_2$O$_3$, etc.) on the bottom electrode, and an upper capacitor electrode thereon. The upper capacitor electrode may be formed by depositing a doped semiconductor layer on the capacitor dielectric layer, or in the alternative, by using the silicide-forming metal ink to form the silicide Schottky contact and the upper electrode at the same time. As with the method for forming diodes, embodiments relating to a capacitor are not limited to forming a silicide contact. Thus, an ohmic contact as described above may also be formed with a metal-semiconductor contact. Exemplary thin film capacitors and methods of forming the same using silicide-forming inks are disclosed in co-pending U.S. patent application Ser. No. 12/243,880, filed Oct. 1, 2008, the relevant portions of which are incorporated herein by reference. Furthermore, methods of forming contacts to doped or undoped silicon layers and forming local interconnects in electronic devices using a silicide-forming metal ink, as well as exemplary electrical structures and devices including such contacts and local interconnects are described in detail in co-pending U.S. patent application Ser. No. 12/175,450, filed on Jul. 17, 2007, the relevant portions of which are incorporated herein by reference.

After forming the layer containing silicon, and optionally, the electrodes (e.g. the gate and source/drain regions in a TFT), a metal ink composition is deposited on the substrate structure. The metal ink generally comprises a bulk metal precursor and a transition metal source (e.g., a silicide-forming transition metal source) as described herein, and a solvent (e.g., an organic solvent). Various examples of suitable ink formulations for use with the present method are previously The ink formulation may be deposited using any suitable deposition technique known in the art. For example, the ink may be deposited by blanket deposition or printing. Coating may include spin coating, dip-coating, spray-coating, slit coating, extrusion coating, meniscus coating, slide-bar coating, pump dispensing, syringe dispensing, microspotting and/or pen-coating the formulation. Printing may include inkjet printing, gravure printing, screen printing, offset printing, flexographic printing, vapor jetting, laser forward transfer or local laser CVD, laser writing, microspotting, spray coating, pump dispensing, stenciling, stamping, laser forward transfer or local laser CVD, etc. The layer of ink may be deposited in a patterned or unpatterned layer. In preferred variations, a patterned layer may be formed by selective deposition techniques, such as inkjet printing, gravure printing, screen printing, or flexographic printing.

In one embodiment, the present metal ink formulation may preferentially wet the exposed silicon surface (relative to an exposed silicon oxide surface) onto which it is printed (see, e.g., co-pending U.S. patent application Ser. No. 12/131,002, filed on May 30, 2008, the relevant portions of which are incorporated by reference herein). Preferential wetting generally takes place when one surface has a higher surface energy than the adjacent surface. Most liquids tend to form balls or spheres on the surface at contact angles greater than 30°. In the present invention, the contact angle of the present metal ink formulation on elemental silicon is preferably significantly lower (e.g., at least 5°, 10°, 15°, 20°, or any other angle of at least 5 or 10° less) than the contact angle on $SiO_2$. Additionally, to increase the preferential wetting effects, the surface tension of the ink formulation should be above 25 dynes/cm (or any other minimum value greater than 25 dynes/cm).

In some variations, the printed ink composition may be dried prior to the curing step. In such embodiments, the ink may be dried by heating the substrate structure with the printed ink at a temperature and for a length of time sufficient to remove solvent(s) in the ink. Temperatures sufficient for removing solvents range from about 80° C. to about 150° C., or any range of temperatures therein (e.g., from about 100° C. to about 120° C.). The lengths of time for removing solvents from a printed ink within these temperature ranges are from about 1 second to about 10 minutes, 10 seconds to about 5 minutes, or any range of times therein (e.g., from about 30 seconds to about 5 minutes, or about 1 minute to 3 minutes, etc.). Heating may take place on a conventional hotplate or in a conventional furnace or oven. Optionally, the heating may occur in an inert atmosphere as described in co-pending U.S. patent application Ser. No. 11/888,949, filed Aug. 3, 2007, the relevant portions of which are incorporated herein by reference.

After the metal ink layer (e.g., a nanoparticle ink) is deposited (and optionally dried), the metal ink layer is cured to remove at least a portion of solvent medium from the layer, and to decompose, reduce, and/or sinter the metal precursors in the ink to form the metal layer (whether patterned or unpatterned). In some embodiments, the curing step may comprise exposing the metal ink composition to a laser. For example, the layer of metal ink may be deposited as a continuous layer in accordance with embodiment of the present invention. In such embodiments, the metal layer may be patterned before the curing step by irradiating with a laser beam having a predetermined spot and/or beam width (e.g., "direct writing"). Thus, a patterned layer (e.g., metal interconnect pattern) may be formed by a selective irradiating and curing process, in which a layer of dried metal ink is selectively cured in a pattern using a laser to write the pattern. In an alternative embodiment, the layer of metal ink can be cured by blanket or flood irradiation (e.g., from a mercury lamp) through a mask, wherein uncured regions of the metal ink layer can then be removed by techniques known in the art, such as masking and etching.

In the alternative, the metal ink may be cured (e.g., annealed) at temperatures at or below 350° C., generally for a period of time sufficient to fuse the metal (nanoparticles) together and form a metallic film. Suitable curing/annealing temperatures generally range from about 100° C. to about 300° C., or any range of temperatures therein (e.g., from about 150° C. to about 250° C.). The annealing time generally ranges from about 1 minute to about 2 hours, (or any range of values therein). In preferred embodiments, the metal-containing film is annealed from about 10 minutes to about 1 hour (e.g., from about 10 to about 30 minutes).

In various embodiments, annealing occurs in a furnace or oven, optionally in an inert or reducing atmosphere. For example, the metal ink may be exposed to a reducing agent and/or atmosphere, and heated at a temperature ranging from greater than ambient temperature to about 200-350° C., depending on the substrate. This process has particular advantages in embodiments where the substrate cannot be processed at a relatively high temperature (e.g., aluminum foil, a polycarbonate, polyethylene and polypropylene esters, a polyimide, etc.). A sealable oven, furnace, or rapid thermal annealing furnace configured with a vacuum source and reducing/inert gas sources may be used for providing the reducing atmosphere and heat (thermal energy) for heterogeneous reduction. In the alternative, the metal precursor film may be thermally decomposed to the elemental metal using a heat source (e.g., a hotplate) in an apparatus in which the atmosphere may be carefully controlled (e.g., a glove box or dry box). Such annealing/reducing processes, and alternatives thereof, are described in co-pending U.S. application Ser. Nos. 11/888,949 and 12/131,002, respectively filed Aug. 3, 2007 and May 30, 2008, the relevant portions of which are incorporated by reference herein.

In some embodiments, the transition metal does not form a solid solution (i.e., an alloy) with the bulk metal, or in the alternative, it has a low solubility in the bulk metal. In such embodiments, the transition metal segregates or phase separates at the interfaces and/or grain boundaries of the bulk metal upon annealing. Annealing the metal ink may result in the transition metal (i.e., the silicide forming metal) migrating to the interface between the metal ink and the silicon layer or substrate on which it is deposited. In this case, the concentration of the silicide-forming transition metal is much higher where it is needed (e.g., at the interface with the device electrodes). In addition, the segregation of the transition metal has the benefit of keeping much of the bulk metal film relatively free of the transition metal. Preferably, the portion of the metal film that is above the interface of the metal film and the substrate is almost exclusively composed of the bulk metal. In general, alloys have higher resitivities than their pure components. Therefore, it is desirable to have the metal film composed of essentially one single metal (i.e., the bulk metal). The phase separation of the transition metal from the bulk metal enables the metal film to have high concentrations of the silicide forming metal at the interface with the device electrode (e.g., n+ or p+ silicon) and a low concentration of the transition metal in the upper portions of the metal film, thus ensuring that its conductivity is high. A high concentration of the silicide forming metal at the interface with the device electrode is advantageous, because a silicide contact layer between the (doped) silicon and metal lines subsequently formed on the structure often provides a contact with low resistivity between the devices and the interconnects.

In preferred embodiments, the present inks may form films with conductivities that are as high as 100% (e.g., 10 to 95%, 20 to 90%, or any other range of values therein) of the bulk metal's conductivity. An exemplary curing process is described in U.S. Pat. No. 7,314,513, the relevant portions of which are incorporated herein by reference.

After the film has been formed, a dielectric layer may be formed over the bulk metal pattern using materials and techniques described herein or otherwise known in the art. The dielectric layer may comprise one or more holes, openings, or vias that expose predetermined regions of the bulk metal pattern (e.g., to facilitate subsequent formation of, and electrical connection to other structures and/or features). Such holes may be formed by selectively printing the dielectric to include the holes that expose portions of the bulk metal pattern. In such embodiments, the holes may be subsequently widened by etching or other techniques known in the art. In embodiments where the dielectric is formed by coating or other blanket deposition techniques, the holes or openings may be subsequently formed therein by conventional techniques. Suitable techniques for forming a dielectric layer with holes or openings (e.g., vias) therein are described in U.S. Pat. No. 7,286,053 and in co-pending U.S. patent application Ser. Nos. 11/888,942, 11/888,949, 12/175,450, and 12/249,735, respectively filed on Aug. 3, 2007, Aug. 3, 2007, Jul. 17, 2008, and Oct. 10, 2008, the relevant portions of each of which are incorporated herein by reference.

After the dielectric layer and/or one or more contact holes are formed, other structures and/or features may be formed thereon (e.g., capacitor electrodes, pads for facilitating communications with external devices, etc.). Alternatively or additionally, a second metal pattern may be formed on the dielectric layer, substantially in accordance with the present invention, but the silicide-forming transition metal is not necessary in the ink. In such embodiments, a second dielectric layer having holes or openings therein may be formed on the second metal pattern as discussed above. Accordingly, additional metallization layers and dielectric layers (having contact holes) may be formed in an alternating sequence. See, e.g., U.S. Pat. No. 7,286,053, co-pending U.S. patent application Ser. Nos. 11/888,942, 11/888,949, 12/175,450, 12/243,880, and 12/249,735, respectively filed on Aug. 3, 2007, Aug. 3, 2007, Jul. 17, 2008, Oct. 1, 2008, and Oct. 10, 2008.

EXAMPLES

Example 1

A nanoparticle ink containing Ag nanoparticles, a Ni source (e.g., Ni(ethylhexanoate)$_2$ or Ni(PF$_3$)$_4$), and an organic solvent was spin coated in air onto a glass sheet. The Ag ink included about 20 wt. % of silver and a smaller amount of the Ni source. The nanoparticle ink was dried and cured at about 300° C. for about 10 minutes to form a metal film. The concentration of each element in the metal film as a function of depth into the film was determined by SIMS. One exemplary film formed in accordance with this general procedure is shown in the graph of FIG. 1.

As shown in FIG. 1, during the curing process, the Ni in the nanoparticle ink segregated to the interfaces of the metal film (i.e., between the printed metal film and the glass sheet, and at the outermost surface of the printed metal film, more so at the interface between the printed metal film and the glass sheet. As a result, it is expected that the transition metal in the ink will segregate to the interface between the metal film and an underlying silicon layer.

Example 2

A series of nanoparticle inks containing about 20% by weight of Ag nanoparticles, from about 0.05% to about 0.75% by weight of Ni(ethylhexanoate)$_2$, and an organic solvent were spin coated in air onto a heavily doped (n+) single crystal silicon wafer with a resistivity of from 0.001 to 0.005 ohm·cm. The nanoparticle ink was dried and cured at about 300° C. (e.g., for about 10 minutes) to form a silver interconnect layer and a nickel silicide contact to the doped silicon.

Figure 2:
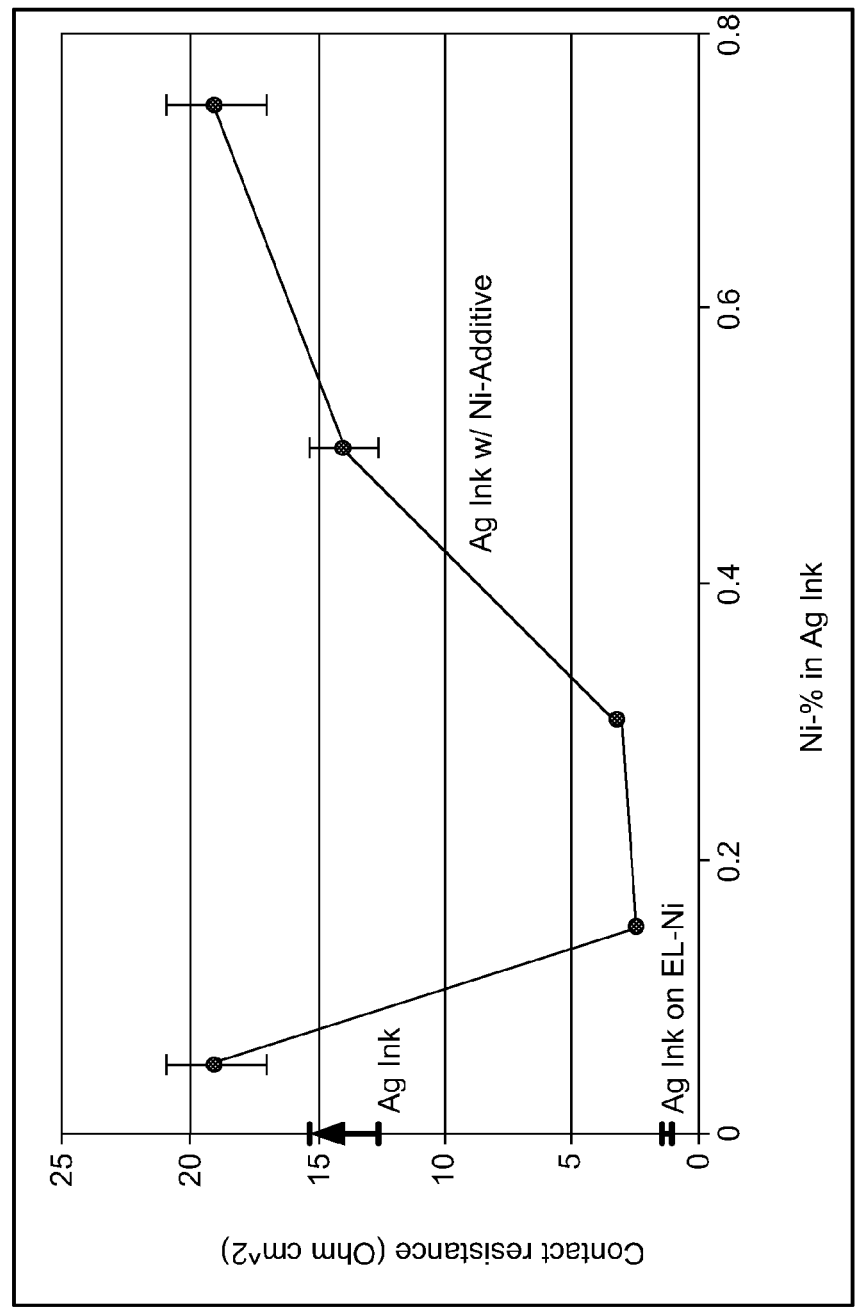
FIG. 2 is a graph showing contact resistance as a function of the nickel additive concentration in a silver-containing ink, according to an embodiment of the present invention.

As shown in FIG. 2, an ink containing substantially the same Ag nanoparticles, in the same organic solvent but without the transition metal source, deposited onto an identical silicon surface (i.e., amorphous n+ silicon), has a resistance of about 12.5-15 Ohm-cm$^2$, and a Ag nanoparticle ink without the transition metal source deposited onto an identical silicon surface with an electrolessly plated (EL)-nickel film formed thereon has a resistance of about 1.5-2 Ohm-cm$^2$.

From the line graph in FIG. 2, it is clear that the added transition metal compound reduced the contact resistance between the printed interconnect metal layer and the heavily doped silicon layer to a value approaching that of the Ag nanoparticle ink deposited onto the EL-nickel film (about 2.5 Ohm-cm$^2$). The relative increase in resistance with increased transition metal concentration may be due to a possible increase in the nickel content in the bulk silver film, or alternatively, from an increase in contamination at the contact interface caused by impurities from the ligand(s) on the nickel compound. However, respective bulk metal and transition metal combinations other than Ag and Ni may give different results.

CONCLUSION/SUMMARY

The present invention relates to metal ink compositions, methods of forming metal ink compositions, and methods of forming conductive layers, such as metal interconnect layers, from such metal ink compositions. Specifically, embodiments of the present invention pertain to forming conductive layers using a metal ink containing additives for improved contact resistance.

The present invention concerns metal ink compositions for use in printed electronics processes, methods of making such metal ink compositions, and methods of simultaneously forming metal interconnects and metal/silicon contacts using such inks. The present metal inks form metal films with high conductivity and form low resistivity contacts with doped (e.g., n+ and/or p+) silicon. The present ink composition decreases the number of inks and printing steps needed to fabricate printed integrated circuits, because the need for separate inks to make interconnects and contacts between doped silicon and the metal interconnect has been eliminated. In addition, the ink formulations described herein may be used in conventional (i.e., non-printed) processing schemes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of forming a metal interconnect layer, comprising:
   a) forming a layer comprising silicon and/or germanium on a substrate;
   b) depositing a metal ink composition on the silicon- and/or germanium-containing layer, the metal ink composition comprising a bulk metal and a silicide-forming transition metal source; and
   c) curing components of the metal ink composition sufficiently to form (i) a metal silicide layer on the silicon- and/or germanium-containing layer from the silicon and/or germanium and the silicide-forming transition metal, and (ii) the metal interconnect layer on the metal silicide layer, the metal interconnect layer comprising the bulk metal.

2. The method of claim 1, further comprising forming a gate dielectric layer on the silicon- and/or germanium-containing layer, and a gate electrode on the gate dielectric, prior to depositing the metal composition.

3. The method of claim 2, further comprising forming source/drain regions adjacent to the gate electrode in or on the silicon- and/or germanium-containing layer.

4. The method of claim 1, wherein depositing the metal ink composition comprises printing the metal ink composition.

5. The method of claim 4, wherein printing the metal ink composition comprises inkjet printing, gravure printing, offset printing, flexographic printing, microspotting, stenciling, stamping, syringe dispensing, pump dispensing, screen printing, laser forward transfer or local laser CVD of the metal ink composition.

6. The method of claim 1, wherein the bulk metal comprises Ag, Pd, Rh, Cu, Pt, Ni, Fe, Ru, Os, Mn, Cr, Mo, Au, W, Co, Ir, Zn, Cd, Al, Ta, or a combination thereof.

7. The method of claim 1, wherein the bulk metal comprises an organometallic compound of the bulk metal, a complex, a salt of the bulk metal, and/or metal particles.

8. The method of claim 1, wherein the transition metal source comprises an organometallic compound of the transition metal, a transition metal complex, a transition metal salt, and/or transition metal nanoparticles.

9. The method of claim 8, wherein the transition metal source comprises the transition metal compound, and the transition metal compound comprises a metal selected from the group consisting of Ti, Ta, W, Mo, Co, Pt, Cr, Pd, and Ni and a plurality of ligands attached thereto.

10. The method of claim 1, wherein the transition metal source is present in the ink in an amount providing no more than about 20 at. % of transition metal atoms relative to atoms of the bulk metal.

11. The method of claim 1, further comprising drying the metal ink composition prior to curing the components of the metal ink composition.

12. The method of claim 1, wherein curing the components of the metal ink composition comprises exposing the metal ink composition to a laser.

13. The method of claim 12, wherein exposing the metal ink composition to a laser comprises selectively irradiating the metal ink composition to form a metal interconnect pattern.

14. The method of claim 1, wherein curing the components of the metal ink composition comprises heating the metal ink composition to a temperature of from about 100° C. to about 350° C. for a period of time sufficient to form a metallic film.

15. The method of claim 1, wherein curing the components of the metal ink composition forms a transition metal silicide layer at an interface between the silicon- and/or germanium-containing layer and a metal interconnect layer formed from the metal ink composition.

16. The method of claim 1, wherein the silicon- and/or germanium-containing layer is highly doped with an n-type dopant or a p-type dopant.

17. The method of claim 1, wherein the bulk metal comprises metal nanoparticles.

18. The method of claim 1, wherein the silicide-forming transition metal does not form a solid solution with the bulk metal.

19. The method of claim 1, wherein the silicon- and/or germanium-containing layer contains silicon.

20. The method of claim 6, wherein the bulk metal comprises Ag, Pd, Rh, Cu, Pt, Ni, Mo, Au, W, Co, or Al.

21. The method of claim 20, wherein the transition metal source comprises a metal selected from the group consisting of Ti, W, Co, Pt, Pd and Ni.

22. The method of claim 20, wherein the bulk metal comprises Ag or Au.

23. The method of claim 22, wherein the transition metal source comprises a metal selected from the group consisting of Pd and Ni.

24. The method of claim 17, wherein the transition metal source comprises an organometallic compound of the transition metal, a transition metal complex, and/or a transition metal salt.

25. The method of claim 1, wherein the metal interconnect layer includes a bulk metal layer consisting essentially of the bulk metal.

26. The method of claim 1, wherein the substrate comprises a glass or ceramic plate, disc, sheet or slip; a semiconductor wafer or disc; or a metal disc, sheet or foil.

27. The method of claim 26, wherein the substrate further comprises one or more buffer, passivation and/or insulating layers thereon.

28. The method of claim 1, wherein forming the silicon- and/or germanium-containing layer comprises depositing a silicon- and/or germanium-containing semiconductor ink or a silicon/germanium precursor ink on the substrate.

29. The method of claim 28, wherein the silicon- and/or germanium-containing semiconductor ink or silicon/germanium precursor ink comprises one or more silane, silagermane, polysilane or polysilagermane compounds and a solvent in which the compound(s) are soluble or suspendable.

30. The method of claim 28, wherein depositing the silicon- and/or germanium-containing semiconductor ink or silicon/germanium precursor ink comprises printing the silicon- and/or germanium-containing semiconductor ink or silicon/germanium precursor ink.

\* \* \* \* \*